(12) United States Patent
Safadi

(10) Patent No.: US 6,862,460 B2
(45) Date of Patent: Mar. 1, 2005

(54) SELF-CONFIGURABLE MULTIPURPOSE MODULAR PORTABLE DEVICE AND METHODS FOR CONFIGURING SAME

(75) Inventor: Reem Safadi, Horsham, PA (US)

(73) Assignee: General Instrument Corporation, Horsham, PA (US)

( * ) Notice: Subject to any disclaimer, the term of this patent is extended or adjusted under 35 U.S.C. 154(b) by 653 days.

(21) Appl. No.: 09/860,745

(22) Filed: May 18, 2001

(65) Prior Publication Data

US 2002/0173339 A1 Nov. 21, 2002

(51) Int. Cl.[7] .............................................. H04M 1/00
(52) U.S. Cl. ............................... 455/553.1; 455/556.2; 455/557; 455/556.1; 348/552; 348/211.99; 348/211.4
(58) Field of Search ........................... 455/553.1, 556.1, 455/556.2, 557, 553; 348/552, 211.99, 211.2, 211.3, 211.4

(56) References Cited

U.S. PATENT DOCUMENTS

| | | | | |
|---|---|---|---|---|
| 5,542,102 A | * | 7/1996 | Smith et al. | 455/462 |
| 6,040,829 A | | 3/2000 | Croy et al. | |
| 6,272,359 B1 | * | 8/2001 | Kivela et al. | 455/567 |
| 6,405,049 B2 | * | 6/2002 | Herrod et al. | 455/517 |
| 6,516,202 B1 | * | 2/2003 | Hawkins et al. | 455/556.2 |
| 6,662,007 B2 | * | 12/2003 | Yuen | 455/419 |
| 2001/0012757 A1 | * | 8/2001 | Boyle | 455/11.1 |
| 2001/0037303 A1 | * | 11/2001 | Mizrahi | 705/52 |
| 2002/0015283 A1 | * | 2/2002 | Sallam | 361/681 |
| 2002/0078363 A1 | * | 6/2002 | Hill et al. | 713/189 |
| 2002/0098878 A1 | * | 7/2002 | Mooney et al | 455/569 |
| 2002/0155860 A1 | * | 10/2002 | Tordera et al. | 455/557 |

* cited by examiner

Primary Examiner—Sonny Trinh
Assistant Examiner—Huy Phan
(74) Attorney, Agent, or Firm—Barry R. Lipsitz; Douglas M. McAllister

(57) ABSTRACT

A self-configurable multipurpose modular portable device and methods for configuring same are provided. Portable device 10 includes a transceiver 20 for wireless communication with a main consumer device 100. Portable device 10 also includes a processor 40 for configuring portable device 10 and modular component 50 based on communications received wirelessly from main consumer device 100. Attachment points 30 are provided on portable device 10 for attaching one or more modular components 50. Depending on the desired functionality, the corresponding modular component 50 (e.g., cellular telephone, personal digital assistant, pager, etc.) may be attached to the portable device 10. The modular portable device can be configured to communicate wirelessly with other intelligent devices, such as Internet enabled appliances and entertainment devices. Further, the modular components 50 can be configured wirelessly to provide independent functionality when not attached to the portable device 10.

66 Claims, 3 Drawing Sheets

US 6,862,460 B2

SELF-CONFIGURABLE MULTIPURPOSE MODULAR PORTABLE DEVICE AND METHODS FOR CONFIGURING SAME

BACKGROUND OF THE INVENTION

The present invention relates to a multipurpose modular portable device which can be used to provide a variety of communication and entertainment functions. In particular, the present invention relates to a self-configurable multipurpose modular portable device and methods for configuring same. The portable device may act as any one of a number of handheld devices, including but not limited to a cellular telephone, a pager, a web pad, a web/phone pad, a remote control, a display device, a keyboard, an MP3 player, a personal digital assistant, or other similar device or combination of devices. The portable device is modular such that depending on the desired functionality, the corresponding modular component (e.g., cellular telephone, personal digital assistant, pager, etc.) may be attached. The portable device is configured by a main consumer terminal (e.g., a set-top terminal), which may authorize various services to be provided by the respective modular components. The modular portable device also allows a user to interact with various intelligent devices in the home, office, and vehicle, such as various Internet enabled devices, including but not limited to home appliances, televisions, stereos, personal computers, video cassette recorders, digital video disk players, digital video recorders, and the like.

There are an ever-increasing number of separate handheld consumer communication devices, personal assistance devices, and portable entertainment devices currently available to consumers, with additional types and variations of such devices being developed at an increasing rate. The use and operation of a number of such separate devices by a consumer is cumbersome. For example, a user may carry a pager, a cellular telephone, and a personal digital assistant as separate devices.

It would be advantageous to provide a generic portable device that may take on several functions, depending on the modular component(s) attached, in a consumer friendly manner. It would be advantageous to provide for a system whereby said portable device is easily configurable to enable the various services and functions provided by each modular componet. The aforesaid and other advantages are provided by the present invention. Corresponding methods and apparatus are provided.

SUMMARY OF THE INVENTION

The present invention relates to a multipurpose modular portable device which can be used to provide a variety of communication and entertainment functions. In particular, the present invention relates to a self-configurable multipurpose modular portable device and methods for configuring same. The portable device includes a transceiver for wireless communication with a main consumer device. One or more attachment points are provided on the portable device for attaching one or more modular components. The portable device also includes a processor for configuring the portable device and the modular component based on communications received from the main consumer device. The portable device communicates with the main consumer device when the portable device is within a predefined range of the main consumer device. Once in the predefined range, the portable device provides the main consumer device with identification information relating to the portable device and the modular component. The main consumer device then provides the portable device with configuration information for the portable device and the modular component.

The modular portable device also allows a user to interact with various intelligent devices in the home, office, and vehicle, such as various Internet enabled devices, including but not limited to home appliances, televisions, stereos, personal computers, video cassette recorders, digital video disk players, digital video recorders, and the like.

The modular component may comprise a web pad, a personal digital assistant, a cellular telephone, a pager, a universal remote control, a wireless or detachable keyboard, speakers, an audio playback device (e.g., an MP3 player or the like), an audiovisual playback device, or any other similar portable personal intelligent devices or variations of such devices, including combinations of such devices.

BRIEF DESCRIPTION OF THE DRAWINGS

The present invention will hereinafter be described in conjunction with the appended drawing figures, wherein like numerals denote like elements, and.

DETAILED DESCRIPTION OF THE INVENTION

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing a preferred embodiment of the invention, it being understood that various changes may be made in the function and arrangement of elements without departing from the spirit and scope of the invention as set forth in the appended claims.

Figure 1:
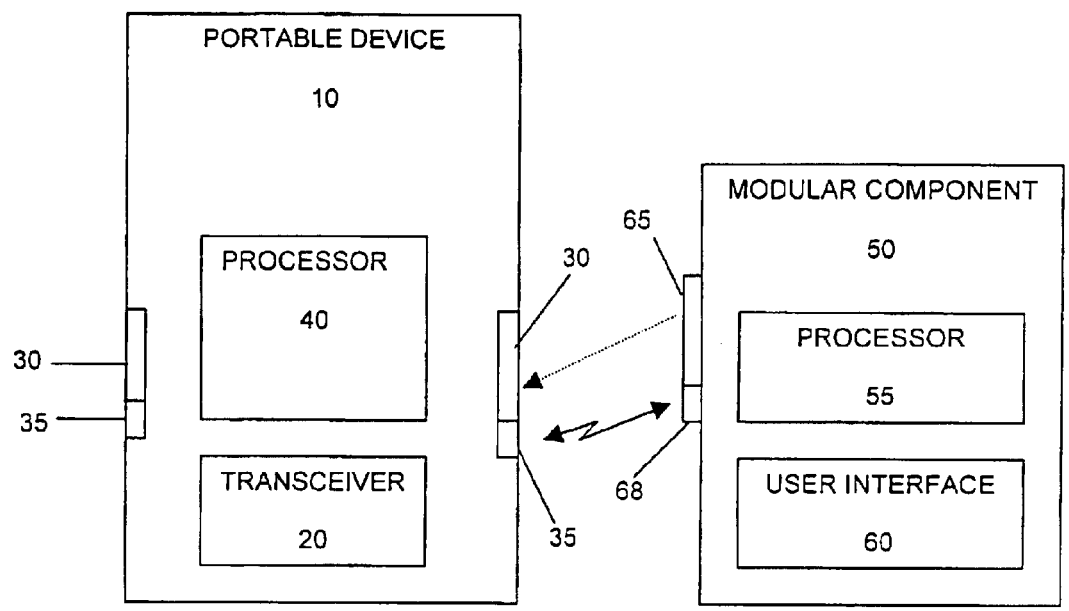
FIG. 1 shows a block diagram of an exemplary embodiment of a portable device and modular component.
Figure 2:
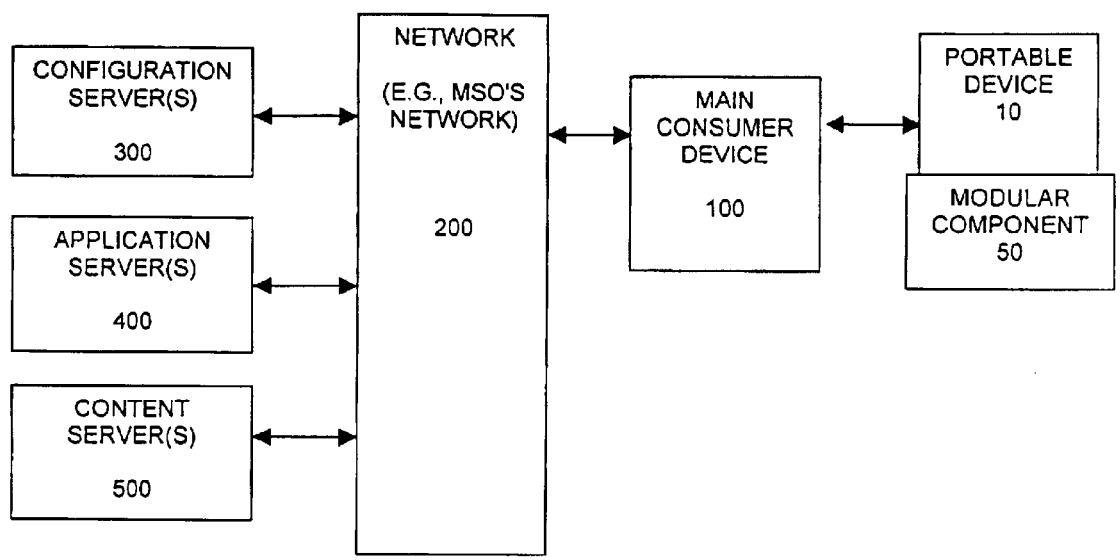
FIG. 2 shows a block diagram of an exemplary embodiment of the invention.

An exemplary embodiment of a self-configurable multipurpose modular portable device in accordance with the invention is shown in FIG. 1. The portable device 10 includes a transceiver 20 for wireless communication with a main consumer device. One or more attachment points 30 are provided on the portable device 10 for attaching one or more modular components 50. The portable device 10 also includes a processor 40 for configuring the portable device 10 and the modular component 50 based on communications received from the main consumer device. As shown in FIG. 2, the portable device 10 communicates with the main consumer device 100 when the portable device 10 is within a predefined range of the main consumer device 100. Once in the predefined range, the portable device 10 provides the main consumer device 100 with identification information relating to the portable device 10 and the modular component 50. The main consumer device 100 then provides the portable device 10 with configuration information for the portable device 10 and the modular component 50.

The modular component 50 may have an attachment point 65 corresponding to attachment point 30 of the portable device 10. The portable device 10 and the modular component 50 may be attached together via any conceivable means. For example, the portable device 10 and the modular component 50 may be connected via a cable and the attachment points may comprise conventional communication ports. Alternatively, the attachment point 65 on the modular component 50 may comprise a printed circuit board edge connector and the corresponding attachment point 30 on the portable device 10 may comprise a slot for receiving the edge connector. The attachment point 65 on the modular component 50 may comprise a plug type attachment point and the corresponding attachment point 30 on the portable device 10 may comprise a plug receptacle. The exact nature and form of the attachment points is not critical to the inventive device. Those skilled in the art will appreciate that numerous types of connections and attachment devices may be used to connect and attach the portable device 10 and the modular component 50. In a further embodiment, the attachment point 65 may also include a wireless interface 68 (to enable, e.g., wireless communications between the modular component 50 and either the portable device 10 or the main consumer device 100 when the modular component 50 is detached from the portable device 10). The portable device 10 may have a corresponding wireless interface 35 as part of attachment point 30.

FIG. 1 shows two attachment points 30 on the portable device 10 for attaching two separate modular components 50 to the portable device 10 at the same time. However, those skilled in the art will appreciate that the invention may be implemented with only one attachment point or with more than two attachment points on the portable device 10.

The portable device 10 may automatically communicate with the main consumer device 100 when the portable device 10 is within the predefined range. For example, the main consumer device 100 may detect the presence of the portable device 10 and automatically communicate with the portable device 10. Similarly, the portable device 10 may detect the presence of the main consumer device, such that it is the portable device 10 that initiates the communication. The portable device 10 may automatically communicate with the main consumer device 100 when the portable device 10 is turned on from an off state. Those skilled in the art will appreciate that other methods of initiating the communication between the portable device 10 and the main consumer device 100 may be implemented. For example, the communication may be automatically enabled as discussed above, whenever the portable device 10 and the main consumer device 100 are within a predefined range. Such automatic communication may be enabled by the communication technology commonly referred to as Bluetooth™, or similar communication technology. Alternatively, communication between the main consumer device 100 and the portable device 10 may be user initiated, e.g., via a user command entered on the portable device 10 or the main consumer device 100. Such user commands may be entered via menu selection options, provided, for example, on a display associated with either the portable device 10 or the main consumer device 100.

The main consumer device 100 may be a Digital Consumer Terminal (DCT) (i.e. a set-top terminal). In the alternative, the main consumer device 100 may be a personal computer or a stand-alone device.

The portable device 10 may be a web pad, a personal digital assistant, an audiovisual display device, or the like.

The modular component 50 is preferably a handheld device. For example, the modular component 50 may comprise a web pad, a personal digital assistant, a cellular telephone, a pager, a universal remote control, a wireless or detachable keyboard, speakers, an audio playback device (e.g., an MP3 player or the like), an audiovisual playback device, or any other similar portable personal intelligent devices or variations of such devices, including combinations of such devices.

As shown in FIG. 1, depending on the modular component type, the modular component 50 may also include a modular component processor 55. For example, the modular component 50 may include a processor 55 where the modular component 50 comprises a web pad, a personal digital assistant, a cellular telephone, or the like. A modular component processor 55 may not be required where the modular component 50 comprises devices such as speakers, a keyboard, a remote control, or the like. In these instances, the modular component may be controlled via the processor 40 of the portable device 10.

FIG. 1 shows the modular component 50 having a user interface 60. Those skilled in the art will appreciate that the type of user interface 60 of the modular component 50 will vary with the type of modular component. For example, if the modular component 50 comprises a cellular telephone, the user interface 60 may comprise a keypad, a display, a microphone and a speaker. If the modular component 50 comprises an audiovisual playback device, the user interface 60 may comprise a display, speakers, and a keypad or a touchpad and keys. Those skilled in the art will also recognize that the particular form of user interface 60 may vary between different models of the same type of modular component (i.e. two different types of personal digital assistant modules may each have a different user interface type). Similarly, those skilled in the art will recognize that the user interface may be provided on the portable device 10, rather than on each modular component 50. In addition, the portable device 10 may include a user interface in addition to the user interface 60 provided on the modular component 50. For example, where the portable device 10 comprises a web pad, a user interface may or may not be provided on the modular components 50.

As shown in FIG. 2, the main consumer device 100 may contact a configuration server 300 (e.g., via network 200) in order to provide appropriate configuration information to the portable device 10 and the modular component 50. The configuration server 300 may contact one or more secondary servers (e.g., application server 400 and content server 500) to activate services provided via the modular component 50. The services may include content delivery services, news services, telephony services, paging services, Internet services, email services, shopping services, and the like. The network 200 may be controlled by a Multiple System Cable Operator (MSO), which can provide the appropriate authorization and configuration information for the specific type of modular component 50 currently in use via the main consumer device 100. In this manner, the MSO may also provide billing functions for the services provided via the portable device 10 and modular component 50.

Figure 3:
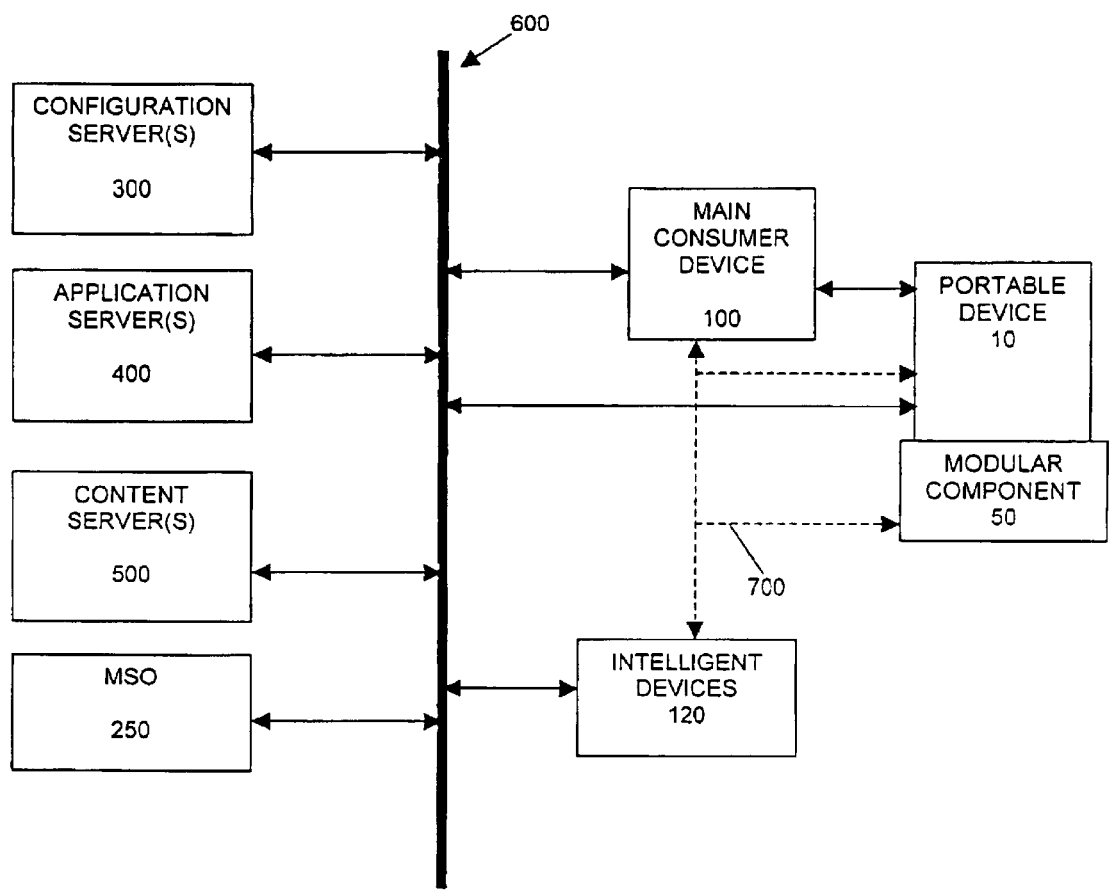
FIG. 3 shows a block diagram of a further exemplary embodiment of the invention.

In an alternate embodiment as shown in FIG. 3, the portable device 10 may communicate directly with various servers, after being configured by the main consumer device 100. The portable device 10 may communicate wirelessly (via network 600) with at least one of configuration servers 300, application servers 400, and content providers 500 to obtain configuration information, application information, and content information, respectively. The configuration information initially received from the main consumer device 100 may include a Uniform Resource Locator (URL) address of at least one of the configuration servers 300, application servers 400, and content providers 500. In such an embodiment, an MSO 250 may still provide authorization, configuration and billing functions for the services provided via the main consumer device 100.

In a further embodiment, the modular components 50 may be enabled to communicate wirelessly (e.g., via a wireless interface 68 included in attachment point 65 as shown in FIG. 1) with the main consumer device 100 when the modular components 50 are detached from the portable device 10. In this manner, the modular components 50 can receive at least one of configuration information, application information, and content information directly from the main consumer device 100 when they are. Detached from the portable device 10, enabling the modular components 50 to function independently of the portable device 10. In such an embodiment, the modular components 50 may take on some or all of the functionality of the portable device 10, depending on the configuration information received and the capabilities of the particular modular component 50. Alternatively, the modular components 50 may be enabled to communicate wirelessly (e.g., via a wireless interface 68 included in attachment point 65 as shown in FIG. 1) with the portable device 10 when the modular components 50 are detached from the portable device 10. The modular components 50 can then receive at least one of configuration information, application information, and content information wirelessly from the portable device 10 even though the modular components 50 and the portable device 10 are separated. Such embodiments enable the modular components 50, which may comprise independently operable devices, to function when detached from the portable device 10. For example, where the modular component 50 comprises a cellular telephone and the portable device 10 comprises a web pad, it may be desirable for the cellular telephone to be operative when it is detached from the portable device 10, especially in those instances where the added functionality of the portable device 10 (in this example a web pad) is not required.

The wireless communication between and among the portable device 10, the detached modular component 50, and the main consumer device 100 may be via point-to-point wireless communications occurring directly between the devices involved. Alternatively, these wireless communications may occur over a wireless home network 700 as shown in FIG. 3.

In a preferred embodiment, the portable device 10 may comprise a web pad. The modular component 50 may comprise a cellular telephone, a pager, a universal remote control, a wireless or detachable keyboard, speakers, a personal digital assistant, an audio playback device, or an audiovisual playback device, or a similar device or combination of devices. The web pad may include a user interactive display device.

In such a preferred embodiment, the main consumer device 100 may be a digital consumer terminal. The web pad of the portable device 10 may receive signals from the digital consumer terminal 100 in response to user commands requesting at least one of specific information content, specific entertainment content, or specific programming content. The user interactive display device displays the specific content in response to the user command. For example, a user may be watching television and desire to view a different television channel than the one currently displayed on the television screen. Rather than change the content being displayed on the television screen, the user can enter a command into the portable device requesting specific data or content which may or may not be program related, which can be tuned to by the main consumer device 100 (in this instance a set-top terminal). The main consumer device 100 can then forward the requested data or content for display on the display device of the portable device 10. In this manner, the user interactive display device may be used for navigating between various television programs without affecting what is currently being displayed on a primary television display device.

The portable device 10 may further comprise a pen and character recognition engine, a touch pad and keys, a keyboard, a mouse, or the like. The web pad may provide electronic program guide functions, user menu selection, television channel selection, content delivery service functions, audiovisual functions, volume selection, and other similar functions.

In an alternate embodiment, the configuration information provided by the main consumer device 100 may enable the portable device 10 to communicate wirelessly with one or more intelligent devices 120. In such an embodiment, the portable device 10 is capable of configuring the intelligent devices 120. Such intelligent devices 120 may include, for example, Internet enabled home appliances such as Internet enabled microwaves, Internet enabled refrigerators, Internet enabled security systems, and the like, as well as digital televisions, stereos, personal computers, Internet appliances, video cassette recorders, digital video recorders, digital video disk players, global positioning devices, or the like. Various types of such intelligent devices 120 currently exist or may be developed in the future. These devices may be located, for example, in homes, offices, automobiles, schools, hotels, factories, and any other location where an Internet enabled device may conceivably be located.

The portable device 10 may include a browser application for enabling the wireless communications between the portable device 10 and the intelligent devices 120. The wireless communications may be direct wireless communications between the portable device 10 and the intelligent devices 120. The wireless communications between the portable device 10 and the intelligent device 120 may comprise direct point-to-point wireless communications. Alternatively, the wireless communications between the portable device 10 and the intelligent device 120 may take place via a wireless home network 700, for example, when the portable device 10 is in the same room as the intelligent device, or otherwise within a predetermined range of the intelligent device 120. Alternatively, the wireless communications may be wireless communications via an external communication network 600. Such communications between the portable device 10 and the intelligent device 120 would take place via the external communication network 600 when, for example, the portable device 10 is at a different location from the intelligent device 120 or outside a predefined range (e.g., when the user is in an automobile using the portable device 10 to communicate with an intelligent device such as an Internet enabled appliance in the home).

The portable device 10 may receive content wirelessly or via the main consumer device 100 (e.g., from content servers 500). This content can be shared between the portable device 10 and the intelligent devices 120. In the event that the content is copyrighted content having restricted usage rules, the portable device 10 shares the content based on the restricted usage rules.

As discussed above, the portable device 10 may communicate wirelessly with at least one of a remote application server 400, a remote configuration server 300, and a remote 25 content server 500 for accessing configuration information, application information, and content information, respectively.

In a further embodiment, the portable device 10 includes a display device capable of displaying an electronic programming guide received from the main consumer device 100. Alternatively, the portable device 10 includes a display device capable of displaying an electronic programming guide received wirelessly from a corresponding remote server (e.g., MSO 250).

The portable device 10 may also have audiovisual playback capabilities for audiovisual content. The audiovisual content may either be associated with or independent of programming currently displayed on an associated television.

It should now be appreciated that the present invention provides an advantageous modular portable device that may take on a variety of functions, depending on the module or modules that are attached, in order to reduce and consolidate the number of portable devices carried by a user. The present invention further provides advantageous means for configuring such a portable device whenever a new or different modular component is attached. The present invention offers a user a wide range of functions in a modular format, so that the portable device can be easily customized in accordance with a user's immediate needs.

Although the invention has been described in connection with various illustrated embodiments, numerous modifications and adaptations may be made thereto without departing from the spirit and scope of the invention as set forth in the claims.

What is claimed is:

1. A self-configurable multipurpose modular portable device, comprising:
    a transceiver for wireless communication with a digital television terminal;
    one or more attachment points for attaching one or more modular components; and
    a processor for configuring the portable device and the modular component based on communications from the digital television terminal; wherein:
        the portable device communicates with the digital television terminal when the portable device is within a predefined range of digital television terminal;
        the portable device provides the digital television terminal with identification information for identifying the portable device and the modular component;
        the digital television terminal receives configuration information via a communication network for configuring the identified portable device and the identified modular component; and
        the portable device is configurable for operation with a plurality of different types of modular components.

2. A portable device in accordance with claim 1, wherein the portable device automatically communicates with the digital television terminal when the portable device is within the predefined range.

3. A portable device in accordance with claim 1, wherein the portable device automatically communicates with the digital television terminal when the portable device is turned on from an off state.

4. A portable device in accordance with claim 1, wherein the communication network comprises a television network.

5. A portable device in accordance with claim 1, wherein the modular component is a handheld device.

6. A portable device in accordance with claim 1, wherein the modular component comprises at least one of:
    a web pad, a personal digital assistant, a cellular telephone, a pager, a universal remote control, a wireless or detachable keyboard, speakers, an audio playback device, or an audiovisual playback device.

7. A portable device in accordance with claim 1, wherein the modular component further comprises a modular component processor.

8. A portable device in accordance with claim 1, wherein the digital television terminal contacts a configuration server in order to provide appropriate configuration information to the portable device and the modular component.

9. A portable device in accordance with claim 8, wherein the configuration server contacts one or more secondary servers to activate services provided via the modular component.

10. A portable device in accordance with claim 9, wherein the services include at least one of content delivery services, news services, telephony services, paging services, Internet services, email services, and shopping services.

11. A portable device in accordance with claim 1, wherein:
    the portable device communicates wirelessly with at least one of configuration servers, application servers, and content providers to obtain configuration information, application information, and content information, respectively.

12. A portable device in accordance with claim 11, wherein:
    the configuration information comprises a Uniform Resource Locator (URL) address of at least one of said configuration servers, application servers, and content providers.

13. A portable device in accordance with claim 1, wherein:
    the modular component is enabled to communicate wirelessly with digital television terminal when the modular component is detached from the portable device.

14. A portable device in accordance with claim 13, wherein:
    the modular component receives at least one of configuration information, application information, and content information wirelessly from the digital television terminal.

15. A portable device in accordance with claim 1, wherein:
    the modular component is enabled to communicate wirelessly with the portable device when the modular component is detached from the portable device.

16. A portable device in accordance with claim 15, wherein:
    modular component receives at least one of configuration information, application information, and content information wirelessly from the portable device.

17. A portable device in accordance with claim 1, wherein:
    the portable device comprises a web pad; and
    the modular component comprises one of a cellular telephone, a pager, a universal remote control, a wireless or detachable keyboard, speakers, a personal digital assistant, an audio playback device, or an audiovisual playback device.

18. A portable device in accordance with claim 17, wherein the web pad comprises a user interactive display device.

19. A portable device in accordance with claim 18, wherein:
    the web pad receives signals from the digital television terminal in response to user commands for requesting at least one of specific information content, specific entertainment content, or specific programming content; and the user interactive display device displays the specific content in response to the user command.

20. A portable device in accordance with claim 19, wherein:
the user interactive display device is adapted to provide navigation between various television programs without affecting what is currently being displayed on a primary television display device.

21. A portable device in accordance with claim 17, wherein the portable device further comprises at least one of a pen and character recognition engine, a touch pad and keys, a keyboard, or a mouse.

22. A portable device in accordance with claim 17, wherein the web pad provides at least one of electronic program guide functions, user menu selection, television channel selection, content delivery service functions, audiovisual functions, and volume selection.

23. A portable device in accordance with claim 1, wherein:
the configuration information enables the portable device to communicate wirelessly with one or more intelligent devices; and
the portable device is capable of configuring the intelligent devices.

24. A portable device in accordance with claim 23, further comprising:
a browser application for enabling the wireless communication between the portable device and the intelligent devices.

25. A portable device in accordance with claim 24, wherein:
the wireless communication comprises direct wireless communication between the portable device and the intelligent devices.

26. A portable device in accordance with claim 24, wherein the wireless communication comprises wireless communication via one of an external communication network or a wireless home network.

27. A portable device in accordance with claim 23, wherein:
the portable device receives content wirelessly or via the digital television terminal; and
the content is sharable between the portable device and the intelligent devices.

28. A portable device in accordance with claim 27, wherein:
the content is copyrighted content having restricted usage rules; and
the portable device shares said content based on said restricted usage rules.

29. A portable device in accordance with claim 23, wherein:
the portable device communicates wirelessly with at least one of a remote configuration server, a remote application server, and a remote content server for accessing configuration information, application information, and content information, respectively.

30. A portable device in accordance with claim 1, wherein:
the portable device includes a display device capable of displaying an electronic programming guide received from the digital television terminal.

31. A portable device in accordance with claim 1, wherein:
the portable device includes a display device capable of displaying an electronic programming guide received wirelessly from a corresponding remote server.

32. A portable device in accordance with claim 1, wherein the portable device has audiovisual playback capabilities for audiovisual content.

33. A portable device in accordance with claim 32, wherein the audiovisual content is either associated with or independent of programming currently displayed on an associated television.

34. A method for configuring a multipurpose modular portable device having one or more attachment points for attaching one or more modular components, comprising:
detecting when the portable device is within a predefined range of a digital television terminal;
providing the digital television terminal with identification information for identifying the portable device and the modular component;
providing the portable device with configuration information from the digital television terminal for the identified portable device and the identified modular component; and
configuring the portable device and the modular component based on the configuration information;
wherein the portable device is configurable for operation with a plurality of different types of modular components.

35. A method in accordance with claim 34, wherein the portable device automatically communicates with the digital television terminal when the portable device is within the predefined range.

36. A method in accordance with claim 34, wherein the portable device automatically communicates with the digital television terminal when the portable device is turned on from an off state.

37. A method in accordance with claim 34, wherein the digital television terminal receives said configuration information via a television network.

38. A method in accordance with claim 34, wherein the modular component is a handheld device.

39. A method in accordance with claim 34, wherein the modular component comprises at least one of:
a web pad, a personal digital assistant, a cellular telephone, a pager, a universal remote control, a wireless or detachable keyboard, speakers, an audio playback device, or an audiovisual playback device.

40. A method in accordance with claim 34, wherein the modular component further comprises a modular component processor.

41. A method in accordance with claim 34, wherein the digital television terminal contacts a configuration server in order to provide appropriate configuration information to the portable device and the modular component.

42. A method in accordance with claim 41, wherein the configuration server contacts one or more secondary servers to activate services provided via the modular component.

43. A method in accordance with claim 42, wherein the services include at least one of content delivery services, news services, telephony services, paging services, Internet services, email services, and shopping services.

44. A method in accordance with claim 34, wherein:
the portable device communicates wirelessly with at least one of configuration servers, application servers, and content providers to obtain configuration information, application information, and content information, respectively.

45. A method in accordance with claim 44, wherein:
the configuration information comprises a Uniform Resource Locator (URL) address of at least one of said configuration servers, application servers, and content providers.

46. A method in accordance with claim 34, wherein: the modular component is enabled to communicate wirelessly with the digital television terminal when the modular component is detached from the portable device.

47. A method in accordance with claim 46, wherein:

the modular component receives at least one of configuration information, application information, and content information wirelessly from the digital television terminal.

48. A method in accordance with claim 34, wherein:

the modular component is enabled to communicate wirelessly with the portable device when the modular component is detached from the portable device.

49. A method in accordance with claim 48, wherein:

the modular component receives at least one of configuration information, application information, and content information wirelessly from the portable device.

50. A method in accordance with claim 34, wherein:

the portable device comprises a web pad; and the modular component further comprises one of a cellular telephone, a pager, a universal remote control, a wireless or detachable keyboard, speakers, a personal digital assistant, an audio playback device, or an audio-visual playback device.

51. A method in accordance with claim 50, wherein the web pad comprises a user interactive display device.

52. A method in accordance with claim 51, wherein;

web pad receives signals from the digital television terminal in response to user commands for requesting at least one of specific information content, specific entertainment content, or specific programming content; and the user interactive display device displays the specific content in response to the user command.

53. A method in accordance with claim 52, wherein:

the user interactive display device is adapted to provide navigation between various television programs without affecting what is currently being displayed on a primary television display device.

54. A method in accordance with claim 50, wherein the portable device further comprises at least one of a pen and character recognition engine, a touch pad and keys, a keyboard, or a mouse.

55. A method in accordance with claim 50, wherein the web pad provides at least one of electronic program guide functions, user menu selection, television channel selection, content delivery service functions, audiovisual functions, and volume selection.

56. A method in accordance with claim 34, wherein:

the configuration information enables the portable device to communicate wirelessly with one or more intelligent devices; and the portable device is capable of configuring the intelligent devices.

57. A method in accordance with claim 56, further comprising:

providing a browser application on the portable device for enabling the wireless communication between the portable device and the intelligent devices.

58. A method in accordance with claim 57, wherein:

the wireless communication comprises direct wireless communication between the portable device and the intelligent devices.

59. A method in accordance with claim 57, wherein the wireless communication comprises wireless communication via one of an external communication network or a wireless home network.

60. A method in accordance with claim 56, wherein:

the portable device receives content wirelessly or via the digital television terminal; and the content is sharable between the portable device and the intelligent devices.

61. A method in accordance with claim 60, wherein:

the content is copyrighted content having restricted usage rules; and the portable device shares said content based on said restricted usage rules.

62. A method in accordance with claim 56, wherein:

the portable device communicates wirelessly with at least one of a remote configuration server, a remote server, and a remote content server for accessing configuration information, application information, and content information, respectively.

63. A method in accordance with claim 34, wherein:

the portable device includes a display device capable of displaying an electronic programming guide received from the digital television terminal.

64. A method in accordance with claim 34, wherein:

the portable devise includes a display device capable of displaying an electronic programming guide received wirelessly from a corresponding remote server.

65. A method in accordance with claim 34, wherein the portable device has audiovisual playback capabilities for audiovisual content.

66. A method in accordance with claim 65, wherein the audiovisual content is either of programming currently displayed on an associated television.

* * * * *

UNITED STATES PATENT AND TRADEMARK OFFICE
CERTIFICATE OF CORRECTION

PATENT NO. : 6,862,460 B2
DATED : March 1, 2005
INVENTOR(S) : Safadi

It is certified that error appears in the above-identified patent and that said Letters Patent is hereby corrected as shown below:

Column 8
Line 36, before the word "modular" insert the word -- the --.

Column 11,
Line 31, before the word "web" insert the word -- the --.

Column 12,
Line 32, at the end of the line, insert the word -- application -- between the words "remote server".
Line 48, after the word "either" insert the words -- associated with or independent --.

Signed and Sealed this

Seventeenth Day of May, 2005

JON W. DUDAS
*Director of the United States Patent and Trademark Office*